(12) United States Patent
Jang et al.

(10) Patent No.: US 12,628,451 B2
(45) Date of Patent: May 12, 2026

(54) IMAGE SENSOR WITH A VARIABLE FILTER LAYER DESIGN

(71) Applicant: SAMSUNG ELECTRONICS CO., LTD., Suwon-si (KR)

(72) Inventors: Minho Jang, Suwon-si (KR); Seungkuk Kang, Seoul (KR); Kwangmin Lee, Seoul (KR); Insung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 488 days.

(21) Appl. No.: 17/814,085

(22) Filed: Jul. 21, 2022

(65) Prior Publication Data

US 2023/0142858 A1 May 11, 2023

(30) Foreign Application Priority Data

Nov. 11, 2021 (KR) ........................ 10-2021-0155162

(51) Int. Cl.
H10F 39/00 (2025.01)
H04N 25/709 (2023.01)
H10K 39/32 (2026.01)

(52) U.S. Cl.
CPC ....... H10F 39/8053 (2025.01); H04N 25/709 (2023.01); H10F 39/802 (2025.01);
(Continued)

(58) Field of Classification Search
CPC ......... H01L 27/14621; H01L 27/14603; H01L 27/14627; H01L 27/14623;
(Continued)

(56) References Cited

U.S. PATENT DOCUMENTS 5,451,766 A 9/1995 Van Berkel
6,300,612 B1 10/2001 Yu
(Continued)

FOREIGN PATENT DOCUMENTS

JP H09-154070 6/1997
JP 2669253 10/1997
(Continued)

OTHER PUBLICATIONS

Majid Aalizadeh et al., "Toward Electrically Tunable, Lithography-Free, Ultra-Thin Color Filters Covering the Whole Visible Spectrum", Scientific Reports, Published online: Jul. 27, 2018.
(Continued)

*Primary Examiner* — Georgia Y Epps
*Assistant Examiner* — Erin R Garber
(74) *Attorney, Agent, or Firm* — Morgan, Lewis & Bockius LLP

(57) ABSTRACT

An image sensor includes a substrate including a plurality of photoelectric conversion elements and a variable filter layer disposed on the substrate. The variable filter layer includes a plurality of first electrodes extending in a first direction, and having a first width in a second direction, a first electro-optical material layer disposed on the plurality of first electrodes, a light-transmitting electrode disposed on the first electro-optical material layer, a second electro-optical material layer disposed on the light-transmitting electrode, and a plurality of second electrodes disposed on the second electro-optical material layer, extending in the second direction, and having a second width in the first direction.

20 Claims, 11 Drawing Sheets

(52) U.S. Cl.
   CPC ......... *H10F 39/803* (2025.01); *H10F 39/806*
        (2025.01); *H10F 39/8063* (2025.01); *H10K*
        *39/32* (2023.02)

(58) Field of Classification Search
   CPC ......... H01L 27/14625; H01L 27/14636; H01L
        27/1464; H01L 27/14665; H01L
        27/14685; H01L 27/14609; H01L
        27/14806; H01L 27/14612; H04N 25/709;
        H10K 39/32; H10F 39/8053; H10F
        39/802; H10F 39/8063; H10F 39/024;
        H10F 39/191; H10F 39/199; H10F
        39/8057; H10F 39/806; H10F 39/811;
        H10F 39/803; H10F 39/80; H10F
        39/8037
   See application file for complete search history.

(56) References Cited

U.S. PATENT DOCUMENTS

| | | | |
|---|---|---|---|
| 9,261,753 B2 | 2/2016 | Guo et al. | |
| 9,438,834 B2 | 9/2016 | Izuha et al. | |
| 9,470,825 B2 | 10/2016 | Numata et al. | |
| 9,654,705 B2 | 5/2017 | Song | |
| 9,806,217 B2 | 10/2017 | Zheng et al. | |
| 10,481,420 B2 | 11/2019 | Bonod et al. | |
| 10,598,966 B2 | 3/2020 | Harada et al. | |
| 2001/0010952 A1* | 8/2001 | Abramovich ......... | H10F 39/024 |
| | | | 438/156 |
| 2012/0091549 A1* | 4/2012 | Chou ................... | H10F 39/024 |
| | | | 257/E31.127 |
| 2013/0334402 A1 | 12/2013 | Izuha et al. | |
| 2017/0168327 A1* | 6/2017 | Han .......................... | E06B 7/28 |
| 2018/0122852 A1* | 5/2018 | Nishimura ........... | H10F 39/011 |
| 2019/0081106 A1* | 3/2019 | Nakata ................... | H04N 25/76 |
| 2019/0346599 A1* | 11/2019 | Komai ............. | H01L 27/14621 |
| 2022/0130881 A1* | 4/2022 | Hsu ...................... | H10F 39/807 |
| 2023/0230986 A1* | 7/2023 | Masuda ........... | H01L 27/14603 |
| | | | 257/292 |
| 2024/0030257 A1* | 1/2024 | Torige .............. | H01L 27/14623 |
| 2024/0047495 A1* | 2/2024 | Chen ................... | H10F 39/8053 |

FOREIGN PATENT DOCUMENTS

| | | | | | |
|---|---|---|---|---|---|
| JP | 2004222062 A | * | 8/2004 | | |
| JP | 5793219 B1 | * | 10/2015 | | |
| KR | 20140008544 A | * | 1/2014 | ....... | H01L 27/14607 |
| WO | 2021/215337 A1 | | 10/2021 | | |

OTHER PUBLICATIONS

Dong-Ho Kim et al., "Thickness dependence of electrical properties of ITO film deposited on a plastic substrate by RF magnetron sputtering", Applied Surface Science 253 (2006) 409-411.
Jai white paper: How does prism technology help to achieve superior colour image quality?, Jun. 21, 2018.
Office Action of Korean Patent Office in Application No. 10-2021-0155162, dated Jul. 11, 2025.

* cited by examiner

FIG. 9

IMAGE SENSOR WITH A VARIABLE FILTER LAYER DESIGN

CROSS-REFERENCE TO RELATED APPLICATION

This U.S. non-provisional patent application claims priority under 35 U.S.C. § 119 to Korean Patent Application No. 10-2021-0155162, filed on Nov. 11, 2021, in the Korean Intellectual Property Office, the disclosure of which is incorporated by reference in its entirety herein.

1. TECHNICAL FIELD

The inventive concept relates to an image sensor.

2. DISCUSSION OF RELATED ART

An image sensor is a device that detects and conveys information used to generate an image. For example, an image sensor may capture a two-dimensional (2D) or three-dimensional (3D) image of an object. An image sensor includes one or more photoelectric conversion elements that convert light into an amount of electrical current that depends on the intensity of light reflected from the object. Examples of image sensors include charge-coupled device (CCD) and a complementary metal-oxide semiconductor (CMOS)-based image sensor. Cameras integrated into small consumer products are typically used CMOS image sensors since they are cheaper and have power consumption in battery powered devices than CCD image sensors. However, CCD image sensors are typically used to broadcast higher quality image data and are typically incorporated into higher end video cameras.

SUMMARY

At least one embodiment of the inventive concept provides an image sensor having improved resolution.

According to an embodiment of the inventive concept, an image sensor is provided. The image sensor includes a substrate including a plurality of photoelectric conversion elements, a variable filter layer disposed on the substrate, and a plurality of microlenses disposed on the variable filter layer. The variable filter layer includes: a plurality of first electrodes extending in a first direction, and having a first width in a second direction, a first electro-optical material layer disposed on the plurality of first electrodes, a light-transmitting electrode disposed on the first electro-optical material layer, a second electro-optical material layer disposed on the light-transmitting electrode, and a plurality of second electrodes disposed on the second electro-optical material layer, extending in the second direction, and having a second width in the first direction.

According to an embodiment of the inventive concept, an image sensor is provided. The image sensor includes a substrate including a plurality of photoelectric conversion elements, a variable filter layer disposed on the substrate, a plurality of conducting patterns providing a path for outputting an electrical signal generated by the plurality of photoelectric conversion elements, and an interlayer insulating layer covering the plurality of conductive patterns. The variable filter layer includes a plurality of first electrodes extending in a first direction, and spaced apart from each other in a second direction, a first electro-optical material layer disposed on the plurality of first electrodes, a light-transmitting electrode disposed on the first electro-optical material layer, a second electro-optical material layer disposed on the light-transmitting electrode, and a plurality of second electrodes disposed on the second electro-optical material layer, extending in the second direction, and spaced apart from each other in the first direction.

According to an embodiment of the inventive concept, an image sensor is provided. The image sensor includes a substrate including a plurality of photoelectric conversion elements, a variable filter layer disposed on the substrate, a plurality of conducting patterns providing a path for outputting an electrical signal generated by the plurality of photoelectric conversion elements, an interlayer insulating layer covering the plurality of conductive patterns, and a plurality of microlenses focusing external light to the plurality of photoelectric conversion elements. The variable filter layer includes a plurality of first electrodes extending in a first direction, a first electro-optical material layer disposed on the plurality of first electrodes, a light-transmitting electrode disposed on the first electro-optical material layer and configured to receive a reference potential, a second electro-optical material layer disposed on the light-transmitting electrode, and a plurality of second electrodes disposed on the second electro-optical material layer and extending in a second direction. One of a first voltage higher than the reference potential and a second voltage lower than the first voltage and higher than the reference potential is applied to each of the plurality of first electrodes, and one of the first voltage and the second voltage is applied to each of the plurality of second electrodes.

According to embodiment of the inventive concept, an operating method of an image sensor is provided. The operating method includes acquiring a first image that is an image of a red visible light band by adjusting a variable filter layer to operate as a red color filter, acquiring a second image that is an image of a green visible light band by adjusting the variable filter layer to operate as a green color filter, and acquiring a third image that is an image of a blue visible light band by adjusting the variable filter layer to operate as a blue color filter. The variable filter layer includes a plurality of photoelectric conversion elements disposed to configure a matrix. The variable filter layer includes a plurality of first electrodes extending in a first direction, and having a first width in a second direction, a first electro-optical material layer disposed on the plurality of first electrodes, a light-transmitting electrode disposed on the first electro-optical material layer, a second electro-optical material layer disposed on the light-transmitting electrode, a plurality of second electrodes disposed on the second electro-optical material layer, extending in the second direction, and having a second width in the first direction.

According to an embodiment of the inventive concept, a method of operating an image sensor is provided. The image sensor includes a plurality of photoelectric conversion elements and a variable filter layer disposed on the plurality of photoelectric conversion elements. The variable filter layer includes a plurality of first electrodes extending in a first direction and spaced apart from each other in a second direction, a first electro-optical material layer disposed on the plurality of first electrodes, a light-transmitting electrode disposed on the first electro-optical material layer, a second electro-optical material layer disposed on the light-transmitting electrode, and a plurality of second electrodes disposed on the second electro-optical material layer, extending in the second direction, and spaced apart from each other in the first direction. The plurality of first electrodes, the first electro-optical material layer, the light-transmitting electrode, the second electro-optical material layer, and the plurality of second electrodes are sequentially stacked in a third direction perpendicular to the first and second directions.

The method includes applying a first voltage to a first portion of the plurality of first electrodes, applying a second voltage lower than the first voltage to a second portion of the plurality of first electrodes, applying the first voltage to a third portion of the plurality of second electrodes, and applying the second voltage to the a fourth portion of the second electrodes.

BRIEF DESCRIPTION OF THE DRAWINGS

Embodiments of the inventive concept will be more clearly understood from the following detailed description taken in conjunction with the accompanying drawings in which:

FIG. 9 is a cross-sectional view illustrating a pixel array of an image sensor according to an example embodiment.

DETAILED DESCRIPTION OF THE EMBODIMENTS

Figure 1:
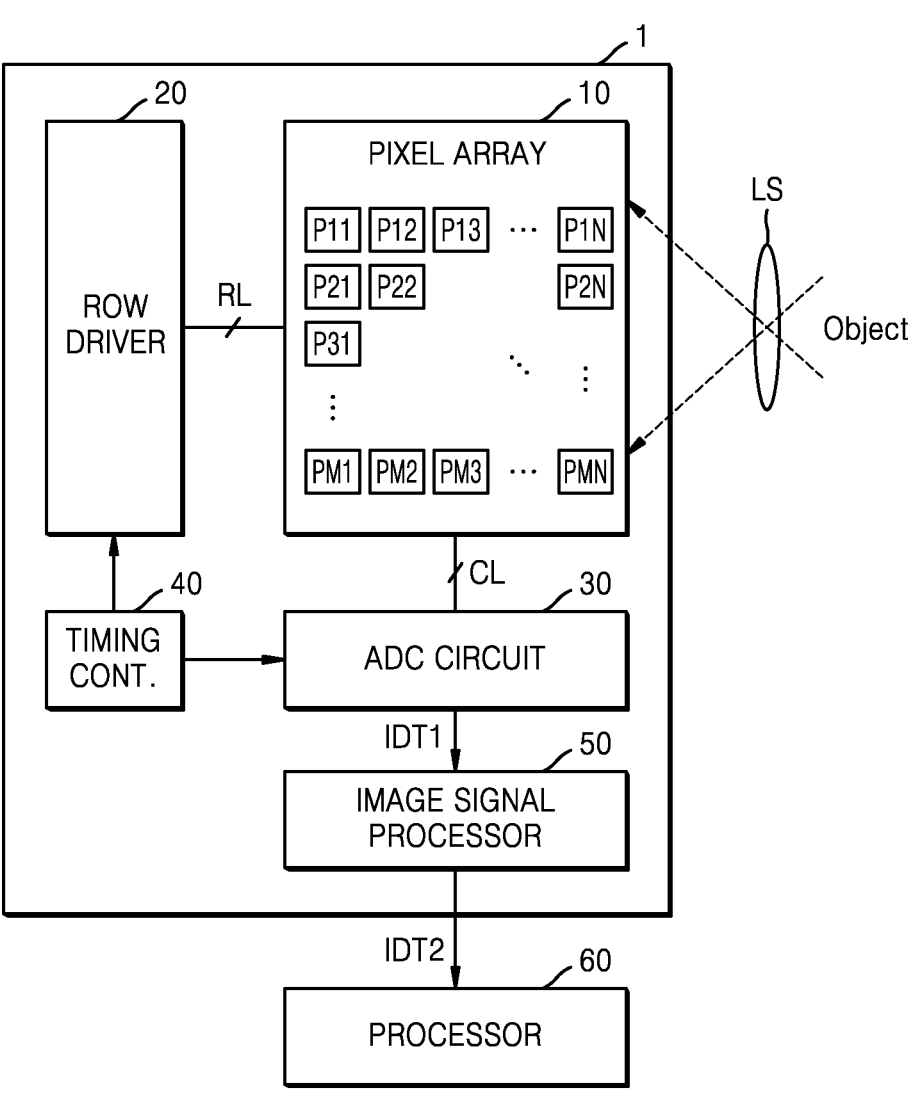
FIG. 1 is a block diagram illustrating an image sensor according to an example embodiment.

Hereinafter, embodiments of the inventive concept are described in detail with reference to the accompanying drawings. The same reference numerals are used for the same components in the drawings, and redundant descriptions thereof are omitted. In the following drawings, the thickness or size of each layer may be exaggerated for convenience and clarity of description, and thus may be slightly different from the actual shapes and ratios.

FIG. 1 is a block diagram illustrating an image sensor 1 according to an example embodiment.

FIG. 1 is a block diagram schematically showing the image sensor 1 according to an example embodiment of the present disclosure.

The image sensor 1 according to an example embodiment of the present disclosure may be mounted on an electronic device having an image or light sensing function. For example, the image sensor 1 may be applied to electronic devices such as a camera, a smartphone, a wearable device, the Internet of Things (IoT), a tablet personal computer (PC), a personal digital assistant (PDA), a portable multimedia player (PMP), a navigation device. In addition, the image sensor 1 may be employed in vehicles, furniture, manufacturing equipment, door, various measurement devices, and the like.

The image sensor 1 may include a pixel array 10, a row driver 20 (e.g., a driver circuit), an analog-to-digital conversion (ADC) circuit 30, a timing controller 40 (e.g., a control circuit), and an image signal processor 50.

The pixel array 10 may receive an optical signal reflected from an object incident through a lens LS and convert the optical signal into an electrical signal. The pixel array 10 may be implemented with a complementary metal oxide semiconductor (CMOS), but is not limited thereto. The pixel array 10 may be part of a charge coupled-device (CCD) chip.

The pixel array 10 may include a plurality of row lines RL, a plurality of column lines CL (or referred to as output lines), and a plurality of pixels P11, P12, P13, . . . , P1N, P21, P22, . . . P2N, P31, . . . PM1, PM2 PM3, . . . PMN, (hereinafter, P11 to PMN) connected to the row lines RL and the column lines CL and arranged in M rows and N columns. In the present example, the number of the plurality of pixels P11 to PMN may be M×N.

Each of the plurality of pixels P11 to PMN may sense a received optical signal using a photoelectric conversion element. For example, each of the pixels P11 to PMN may include one or more photoelectric conversion elements. The plurality of pixels P11 to PMN may detect the amount of light of the optical signal and output an electrical signal indicating the detected amount of light.

The row driver 20 may generate a plurality of control signals capable of controlling an operation of the pixels P disposed in each row under the control of the timing controller 40. The row driver 20 may provide a plurality of control signals to each of the pixels P11 to PMN of the pixel array 10 through the plurality of row lines RL. In response to the control signals provided from the row driver 20, the pixel array 10 may be driven in units of rows.

The pixel array 10 may output a plurality of sensing signals through the column lines CL under the control of the row driver 20.

The ADC circuit 30 may convert each of the sensing signals received through the column lines CL from an analog form into a digital form. The ADC circuit 30 may include an ADC corresponding to each of the column lines CL, and the ADC may convert a sensing signal received through a corresponding column line into a pixel value. According to an operation mode of the image sensor 1, the pixel value may indicate the amount of light sensed by the plurality of pixels P11 to PMN.

The ADC may include a correlated double sampling (CDS) circuit for sampling and holding the received signal. The CDS circuit may double-sample a noise signal when the plurality of pixels P11 to PMN are in a reset state and a sensing signal, and output a signal corresponding to a difference between the sensing signal and the noise signal. The ADC may include a counter, and the counter may count a signal received from the CDS circuit to generate a pixel value. For example, the CDS circuit may be implemented as an operational transconductance amplifier (OTA), a differential amplifier, or the like. The counter may be implemented as, for example, an up-counter and arithmetic circuit, an up/down counter, and a bit-wise inversion counter.

The timing controller 40 may generate timing control signals for controlling operations of the row driver 20 and the ADC circuit 30. The row driver 20 and the ADC circuit 30 may drive the pixel array 10 in units of rows as described above based on the timing control signals from the timing controller 40, and may convert a plurality of sensing signals received through the plurality of column lines CL into a pixel value.

The image signal processor 50 may receive first image data IDT1, e.g., raw image data, from the ADC circuit 30, and perform signal processing on the first image data IDT1 to generate second image data IDT2. The image signal processor 50 may perform signal processing such as black level compensation, lens shading compensation, crosstalk compensation, and bad pixel compensation.

The second image data IDT2 output from the image signal processor 50, e.g., signal-processed image data, may be transmitted to a processor 60. The processor 60 may be a host processor of an electronic device on which the image sensor 1 is mounted.

Figure 2:
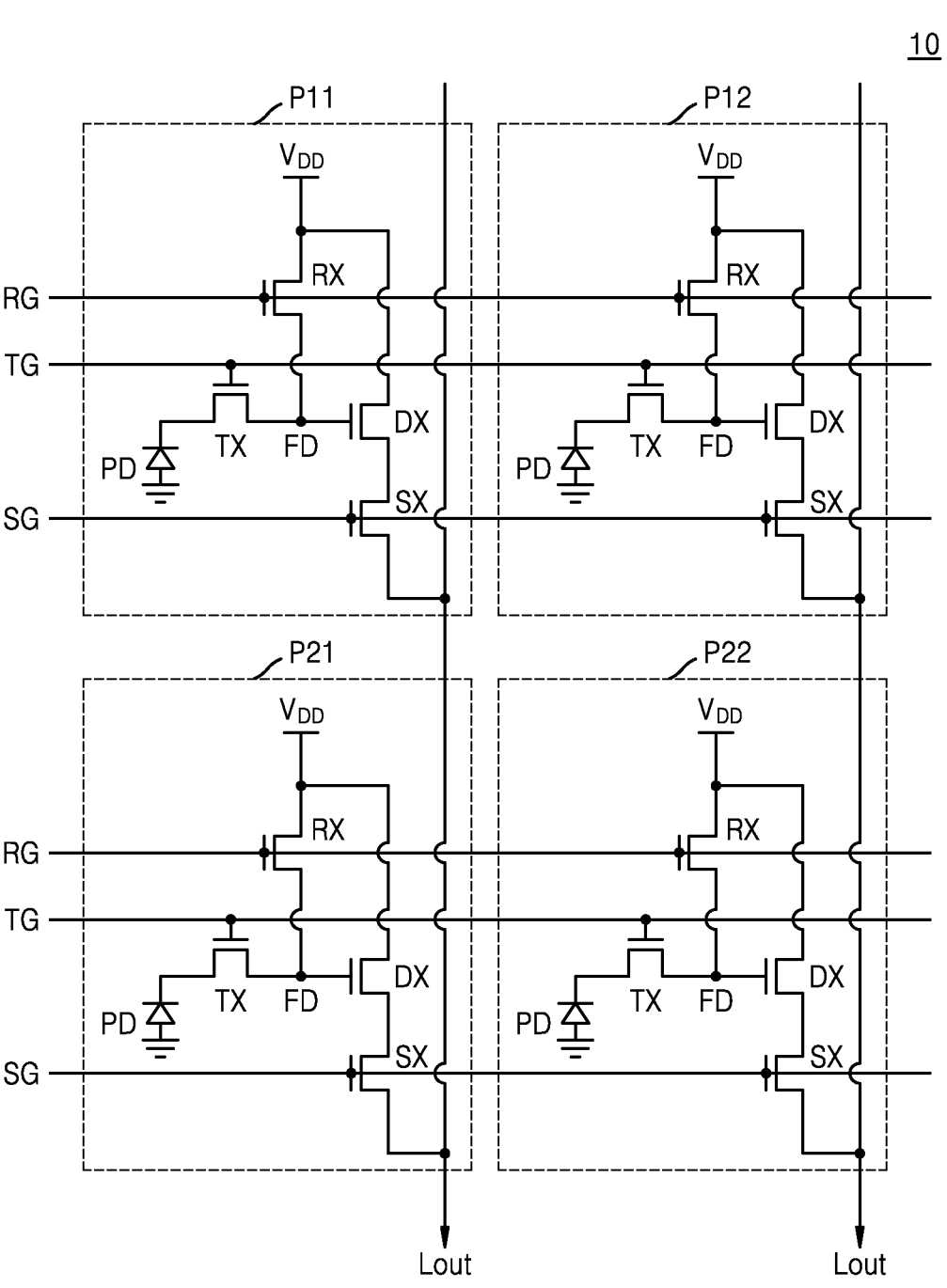
FIG. 2 is a circuit diagram illustrating a pixel included in an image sensor according to an example embodiment.

FIG. 2 is a circuit diagram illustrating pixels included in the image sensor 1 according to an example embodiment.

Referring to FIGS. 1 and 2, the pixel array 10 may include a plurality of pixels P11, P12, P21, and P22. The pixels P11, P12, P21, and P22 may be arranged in a matrix form. For convenience of illustration, only four pixels P11, P12, P21, and P22 are illustrated in FIG. 2, but descriptions thereof may be similarly applied to each of the plurality of pixels P11 to PMN included in the pixel array 10.

In an example embodiment, each of the pixels P11, P12, P21, and P22 includes a transfer transistor TX and logic transistors RX, SX, and DX. Here, the logic transistors RX, SX, and DX may include a reset transistor RX, a selection transistor SX, and a drive transistor DX.

A photoelectric conversion element PD may generate and accumulate photo charges in proportion to the amount of externally incident light. The photoelectric conversion element PD may be a photo-sensing element formed of an organic material or an inorganic material, such as an inorganic photodiode, an organic photodiode, a perovskite photodiode, a phototransistor, a photogate or pinned photodiode, and an organic photoconductive film.

A transfer transistor TX may transfer charges accumulated in the photoelectric conversion element PD to a floating diffusion region FD based on a transfer signal TG. Photo charges generated by the photoelectric conversion element PD may be stored in the floating diffusion region FD. The drive transistor DX may be controlled by the amount of photo charges accumulated in the floating diffusion region FD. The transfer signal TG may be applied to a gate terminal of the transfer transistor TX.

The reset transistor RX may periodically reset charges accumulated in the floating diffusion region FD based on a reset signal RG. The reset signal RG may be applied to a gate terminal of the reset transistor RX. A drain electrode of the reset transistor RX may be connected to the floating diffusion region FD, and a source electrode thereof may be connected to a node receiving a power voltage VDD. When the reset transistor RX is turned on, the power voltage VDD applied to the source electrode of the reset transistor RX may be transferred to the floating diffusion region FD. Accordingly, when the reset transistor RX is turned on, charges accumulated in the floating diffusion region FD may be discharged and the floating diffusion region FD may be reset.

In the drive transistor DX, each of the pixels P11, P12, P21, and P22, and a constant current source may configure a source follower buffer which amplify a potential change in the floating diffusion region FD, and output the amplified potential change to the output line Lout.

The selection transistor SX may select the pixels P11, P12, P21, and P22 from which to read a photoelectric signal value sensed in units of rows based on a selection signal SG. The selection signal SG may be applied to a gate terminal of the selection transistor SX. When the selection transistor SX is turned on, the power voltage VDD may be transferred to a source electrode of the drive transistor DX.

Figure 3:
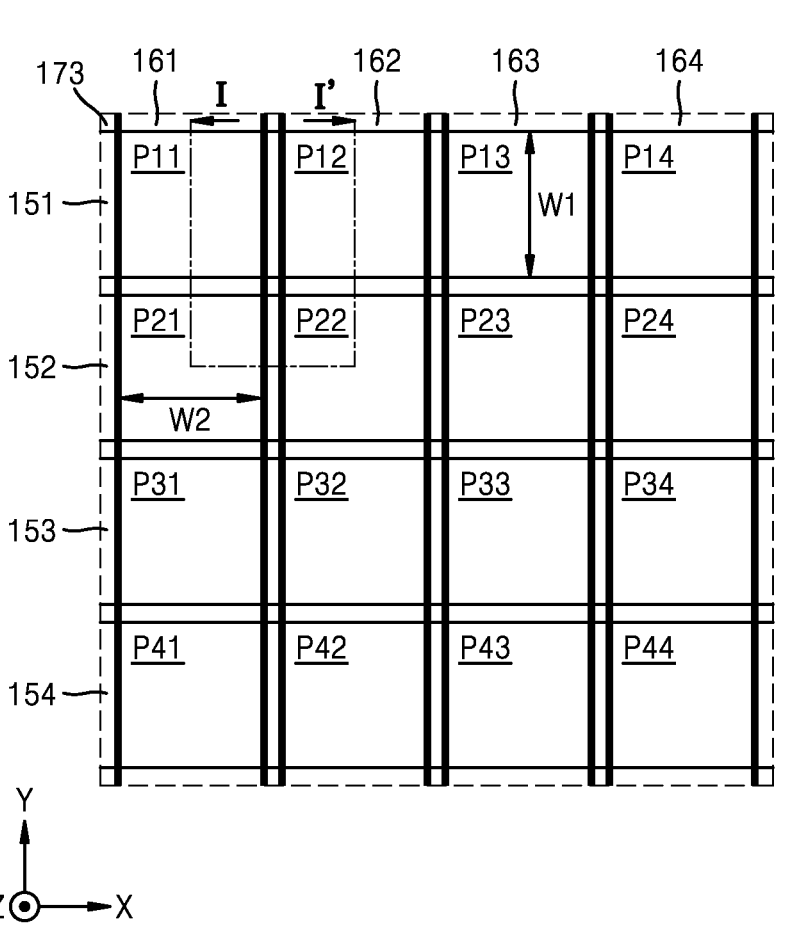
FIG. 3 illustrates a layout of a pixel array of an image sensor according to an example embodiment.

FIG. 3 shows a layout of the pixel array 10 of the image sensor 1 according to an example embodiment.

Figure 4:
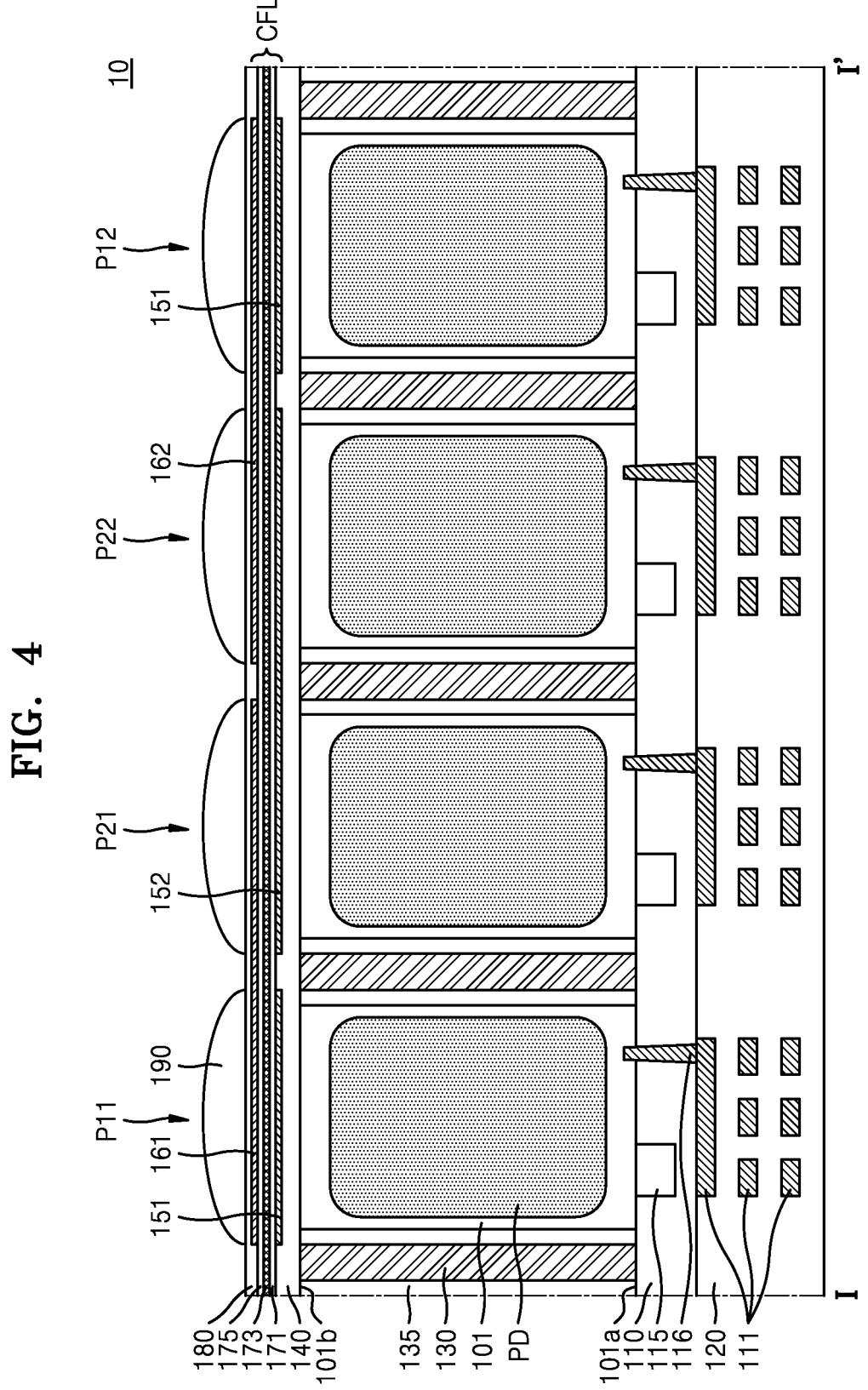
FIG. 4 is a cross-sectional view taken along line I-I' of FIG. 3.

FIG. 4 is a cross-sectional view taken along line I-I' of FIG. 3.

Referring to FIGS. 3 and 4, the pixel array 10 of the image sensor 1 (see FIG. 1) may include a substrate 101, a photoelectric conversion element PD, a gate electrode 115, an insulating layer 110, a contact via 116, conductive patterns 111, an interlayer insulating layer 120, first and second device isolation layers 130 and 135, a passivation layer 140, a planarization layer 180, a variable filter layer CFL, and a plurality of micro-lenses 190.

The substrate 101 may include a first surface 101a and a second surface 101b that face each other. The first surface 101a of the substrate 101 may be a front surface of the substrate 101, and the second surface 101b of the substrate 101 may be a rear surface of the substrate 101.

Two directions substantially parallel to the first surface 101a and substantially perpendicular to each other are defined as an X direction and a Y direction, and a direction substantially perpendicular to the first surface 101a is defined as a Z direction. The X direction, the Y direction, and the Z direction may be perpendicular to each other.

A plurality of pixels P11, P12, P13, P14, P21, P22, P23, P24, P31, P32, P33, P34, P41, P42, P43, P44 (hereinafter, P11 to P44) are formed in the substrate 101. The plurality of pixels P11 to P44 may be arranged in a matrix form in a plan view.

A plurality of dummy pixels may be formed in the substrate. According to an example embodiment, the plurality of pixels P11 to P44 may be disposed at the center of the matrix, and the dummy pixels may be disposed at the edges of the matrix.

According to an example embodiment, the first device isolation layer 130 may extend in the X and Y directions between the plurality of pixels P11 to P44 to horizontally separate the pixels P11 to P44 adjacent to each other. In an example embodiment, the second device isolation layer 135 may be disposed between the first device isolation layer 130 and the pixels P11 to P44.

The first device isolation layer 130 may include a material having excellent gap fill performance, for example, poly-silicon (poly-Si). According to an example embodiment, the first device isolation layer 130 may be doped with a P-type dopant, e.g., boron (B), but is not limited thereto. According to an embodiment, the first device isolation layer 130 has substantially the same length as that of the substrate 101 in the Z direction to separate the plurality of pixels P11 to P44 and the dummy pixels from each other.

The second device isolation layer 135 may include an insulating material. According to an example embodiment, the second device isolation layer 135 includes a material having a high dielectric constant, but is not limited thereto.

Here, the substrate 101 and the first device isolation layer 130 may act as electrodes of a capacitor, and the second device isolation layer 135 may act as a dielectric layer of the capacitor. Accordingly, a voltage difference between the substrate 101 and the first device isolation layer 130 may be maintained substantially constant.

In an example embodiment, a predetermined potential may be applied to the substrate 101 through the contact via 116. According to an embodiment, the potential of the substrate 101 may be a ground potential, but is not limited thereto. According to an example embodiment, a potential different from that applied to the substrate 101 may be applied to the first device isolation layer 130. According to some embodiments, because the first device isolation layer 130 is doped polysilicon, the first device isolation layer 130 may have substantially the same potential as a whole.

According to an example embodiment, by applying a voltage lower than that of the substrate 101 to the first device isolation layer 130, an energy barrier between the first device isolation layer 130 and the substrate 101 may be increased to reduce dark current. Accordingly, the reliability of the image sensor 1 may be improved.

In an example embodiment, the photoelectric conversion element PD, for example, a photodiode, may be formed in the substrate 101. The gate electrode 115 may be disposed to be spaced apart from each other on the first surface 101a of the substrate 101. The gate electrode 115 may be, for example, any one of a gate electrode of a charge transistor TX of FIG. 2, a gate electrode of the reset transistor RX, and a gate electrode of the drive transistor DX of FIG. 2.

Although the gate electrode 115 is illustrated as being disposed on the first surface 101a of the substrate 101 in FIG. 3, the inventive concept is not limited thereto. For example, the gate electrode 115 may be buried in the substrate 101.

The interlayer insulating layer 120 and the conductive patterns 111 may be disposed on the first surface 101a of the substrate 101. The conductive patterns 111 may be covered by the interlayer insulating layer 120. The conductive patterns 111 may be protected and insulated by the interlayer insulating layer 120.

The interlayer insulating layer 120 may include, for example, silicon oxide, silicon nitride, silicon oxynitride, or the like. The conductive patterns 111 may include, for example, aluminum (Al), copper (Cu), tungsten (W), cobalt (Co), ruthenium (Ru), and the like.

The conductive patterns 111 may include a plurality of stacked wirings at different levels. In FIG. 3, the conductive patterns 111 are illustrated as including three sequentially stacked layers, but are not limited thereto. For example, conductive patterns 111 of two layers or four or more layers may be formed in the interlayer insulating layer 120.

The insulating layer 110 may be disposed between the first surface 101a of the substrate 101 and the interlayer insulating layer 120. The insulating layer 110 may cover the gate electrode 115 disposed on the first surface 101a of the substrate 101. In example embodiments, the insulating layer 110 may include an insulating material such as silicon oxide, silicon nitride, silicon oxynitride, or the like.

The passivation layer 140 may be disposed on the second surface 101b of the substrate 101. In an example embodiment, the passivation layer 140 may be in contact with the second surface 101b of the substrate 101. According to an example embodiment, the passivation layer 140 may include, but is not limited to, an amorphous high-k material.

A variable filter layer CFL and a planarization layer 180 covering the variable filter layer CFL may be formed on the passivation layer 140. The planarization layer 180 may include, for example, an oxide layer, a nitride layer, a low-k material, and a resin. According to an example embodiment, the planarization layer 180 may include a multi-layer structure.

The variable filter layer CFL may be disposed on the passivation layer 140. The variable filter layer CFL may be disposed on the second surface 101b of the substrate 101. The variable filter layer CFL may include first electrodes 151, 152, 153, and 154, second electrodes 161, 162, 163, and 164, a first electro-optical material layer 171, a light-transmitting electrode 173, and a second electro-optical material layer 175.

The variable filter layer CFL may be configured to transmit light of the same or different wavelength bands to each of the plurality of pixels P11 to P44. In an example embodiment, a thickness of the variable filter layer CFL in the Z direction is in a range of about 100 nm to about 200 nm.

According to an example embodiment, the first electrodes 151, 152, 153, and 154 may be disposed on the passivation layer 140. The first electrodes 151, 152, 153, and 154 may contact the passivation layer 140. The first electrodes 151, 152, 153, and 154 may extend in the X direction. The first electrodes 151, 152, 153, and 154 may be spaced apart from each other in the Y direction. The passivation layer 140 may cover side surfaces of the first electrodes 151, 152, 153, and 154. Accordingly, adjacent ones of the first electrodes 151, 152, 153, and 154 may be spaced apart from each other with a portion of the passivation layer 140 therebetween. However, the inventive concept is not limited thereto, and the passivation layer 140 may be disposed entirely below the first electrodes 151, 152, 153 and 154, and an additional insulating layer or a portion of the first electro-optical material layer 171 may be between adjacent ones of the first electrodes 151, 152, 153, and 154. In an embodiment, a width W1 of the first electrodes 151, 152, 153, and 154 in the Y direction is substantially the same as a width of the plurality of pixels P11 to P44 in the Y direction.

In an example embodiment, the first electrodes 151, 152, 153, and 154 include a conductive material. According to an example embodiment, the first electrodes 151, 152, 153, and 154 include a metal material such as silver (Ag), but is not limited thereto. The first electrodes 151, 152, 153, and 154 may include at least one metal selected from the group consisting of copper (Cu), aluminum (Al), nickel (Ni), gold (Au), platinum (Pt), tin (Sn), lead (Pb), titanium. In an embodiment, the first electrodes 151, 152, 153, and 154 include at least one metal selected from the group consisting of (Ti), chromium (Cr), palladium (Pd), indium (In) and zinc (Zn), metal alloys thereof, or carbon (C).

The first electro-optical material layer 171 may be disposed on the first electrodes 151, 152, 153, and 154. The first electro-optical material layer 171 may cover the first electrodes 151, 152, 153, and 154. The first electro-optical material layer 171 may contact each of the first electrodes 151, 152, 153, and 154.

The first electro-optical material layer 171 may include a material having a refractive index changing according to an applied voltage. According to an example embodiment, the refractive index of the first electro-optical material layer 171 may be adjusted by a potential difference between the first electrodes 151, 152, 153, and 154 and the light-transmitting electrode 173.

According to example embodiments, the first electro-optical material layer 171 may include one of 4-N,N-dimethylamino-4'-N'-methyl-stilbazolium tosylate, lithium niobide ($LiNbO_3$), lithium tantalate ($LiTaO_3$), potassium titanyl phosphate (KTP), and beta ($\beta$)-barium borate (BBO).

The light-transmitting electrode 173 may be disposed on the first electro-optical material layer 171. The light-transmitting electrode 173 may cover the first electro-optical material layer 171. The light-transmitting electrode 173 may contact the first electro-optical material layer 171.

The light-transmitting electrode 173 may be transparent to a visible light band. For example, visible light may pass through the light-transmitting electrode 173. The light-transmitting electrode 173 may include a conductive material. A reference potential GND may be applied to the light-transmitting electrode 173. For example, the image sensor 1 may include a voltage generator that applies the reference potential GND. The light-transmitting electrode 173 may extend in the X-direction and the Y-direction over the entire pixel array 10. However, the inventive concept is not limited thereto, and a plurality of light-transmitting electrodes 173 disposed at the same level may divide and cover the pixel array 10, and the reference potential GND may be applied to each of the light-transmitting electrodes 173.

According to example embodiments, the light-transmitting electrode 173 may include one of a transparent conducting oxide (TCO) such as indium tin oxide (ITO), a silver nanowire, a carbon nanotube (CNT), graphene, and a conducting polymer.

The second electro-optical material layer 175 may be disposed on the light-transmitting electrode 173. The second electro-optical material layer 175 may cover the light-transmitting electrode 173. The second electro-optical material layer 175 may contact the light-transmitting electrodes 173.

In an embodiment, the second electro-optical material layer 175 includes a material having a refractive index changing according to an applied voltage. According to an example embodiment, the refractive index of the second electro-optical material layer 175 is adjusted by a potential difference between the second electrodes 161, 162, 163, and 164 and the light-transmitting electrode 173.

According to an example embodiment, the second electro-optical material layer 175 includes one of the materials included in the first electro-optical material layer 171.

The second electrodes 161, 162, 163, and 164 may be disposed on the second electro-optical material layer 175. The second electrodes 161, 162, 163, and 164 may contact the second electro-optical material layer 175. The second electrodes 161, 162, 163, and 164 may extend in the Y direction. The second electrodes 161, 162, 163, and 164 may be spaced apart from each other in the X direction.

The planarization layer 180 may cover top surfaces and side surfaces of the second electrodes 161, 162, 163, and 164. Accordingly, adjacent ones of the second electrodes 161, 162, 163, and 164 may be spaced apart from each other with a portion of the planarization layer 180 therebetween. In an embodiment, a width W2 of the second electrodes 161, 162, 163, and 164 in the X direction is substantially the same as a width of the plurality of pixels P11 to P44 in the X direction.

In an example embodiment, the second electrodes 161, 162, 163, and 164 include a conductive material. According to example embodiments, the second electrodes 161, 162, 163, and 164 may include the materials described above in relation to the first electrodes 151, 152, 153 and 154.

In an example embodiment, a portion of the variable filter layer CFL overlapping the pixels P11 to P44 is a color filter of the overlapping the plurality of pixels P11 to P44.

For example, the first electrode 151, the second electrode 161, and a portion of the first electro-optical material layer 171 between the first electrode 151 and the second electrode 161, a portion of the light-transmitting electrode 173 between the first electrode 151 and the second electrode 161, and a portion of the second electro-optical material layer 175 between the first electrode 151 and the second electrode 161 may be a color filter of the pixel P11. The first electrode 153, the second electrode 164, and a portion of the first electro-optical material layer 171 between the first electrode 153 and the second electrode 164, a portion of the light-transmitting electrode 173 between the first electrode 153 and the second electrode 164, and a portion of the second electro-optical material layer 175 between the first electrode 153 and the second electrode 164 may be a color filter of the pixel P34. The first electrode 154, the second electrode 162, and a portion of the first electro-optical material layer 171 between the first electrode 154 and the second electrode 162, a portion of the light-transmitting electrode 173 between the first electrode 154 and the second electrode 162, and a portion of the second electro-optical material layer 175 between the first electrode 154 and the second electrode 162 may be a color filter of the pixel P42.

In a color filter including an organic material, a wavelength band of light received for each pixel is determined at the time of initial manufacturing. Accordingly, an image including information on red visible light, green visible light, and blue visible light may be stored with a single photographing, but each pixel does not obtain information on red visible light, green visible light, and blue visible light, so resolution of the image is low. In addition, fine patterning is difficult due to the nature of organic material patterning.

According to example embodiments, as described with reference to FIGS. 5 to 7C, the variable filter layer CFL may operate as a Bayer pattern color filter that simultaneously receives red visible light, green visible light and blue visible light or may operate as a red filter that receives only red visible light, a green filter that receives only green visible light, and a blue filter that receives only blue visible light by controlling a voltage applied to the first and second electrodes 151, 152, 153, 154, 161, 162, 163, and 164. Accordingly, the resolution quality of the image generated by the pixel array 10 may be improved.

In addition, because the variable filter layer CFL is provided through patterning of an insulating material and a metallic material, its dimensions may be reduced, as compared to prior organic-type color filters. For example, the width W1 of each of the first electrodes 151, 152, 153, and 154 in the Y direction and the width W2 of each of the second electrodes 161, 162, 163 and 164 in the X direction may be reduced, compared with prior organic-type color filters, and accordingly, the plurality of pixels P11 to P44 may be reduced in size.

Furthermore, a dimension of prior organic-type color filters in the Z direction is about 500 nm, whereas a dimension of the variable filter layer CFL according to an example embodiment in the Z direction may range between about 100 nm and 200 nm. Thus, the variable filter layer CFL according to example embodiments may reduce the dimension of the pixel array 10 in the Z-direction.

The plurality of microlenses 190 may be disposed on the planarization layer 180. The plurality of microlenses 190 may be formed of an organic material such as a photosensitive resin or an inorganic material. The plurality of microlenses 190 may condense incident light to the photoelectric conversion element PD.

Each of the plurality of microlenses 190 may vertically overlap a corresponding one of the photoelectric conversion elements PD. Accordingly, one of the plurality of microlenses 190 and one of the photoelectric conversion elements PD may be disposed in each of the pixels P11 to P44.

Figure 5:
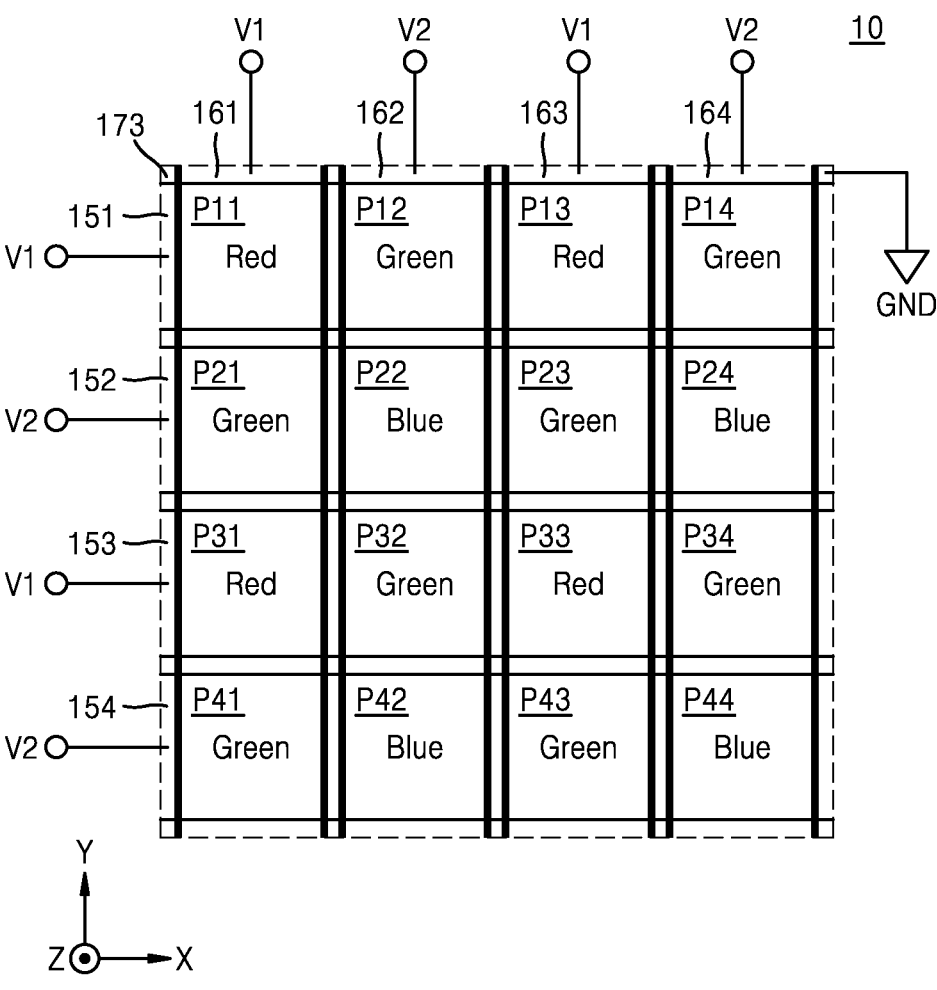
FIG. 5 is a diagram for describing an operation of a pixel array according to an example embodiment.

FIG. 5 is a diagram illustrating an operation of the pixel array 10 according to an example embodiment.

Referring to FIGS. 4 and 5, a first voltage V1 may be applied to the first electrodes 151 and 153, a second voltage V2 may be applied to the first electrodes 152 and 154, the first voltage V1 may be applied to the second electrodes 161 and 163, and the second voltage V2 may be applied to the second electrodes 162 and 164. A ground potential GND may be applied to the light-transmitting electrode 173. In an embodiment, a voltage generator within the image sensor 1 is configured to generate the first voltage V1 and the second voltage V2.

Accordingly, the first voltage V1 may be applied to a portion of the first electro-optical material layer 171 overlapping the pixels P11, P13, P31, and P33, and the first voltage V1 may be applied to a portion of the second electro-optical material layer 175 overlapping the pixels P11, P13, P31, and P33.

In addition, the first voltage V1 may be applied to a portion of the first electro-optical material layer 171 overlapping the pixels P12, P14, P32, and P34, and the second voltage V2 may be applied to the second electro-optical material layer 175 overlapping the pixels P12, P14, P32, and P34.

In addition, the second voltage V2 may be applied to a portion of the first electro-optical material layer 171 overlapping the pixels P21, P23, P41, and P43, and the first voltage V1 may be applied to a portion of the second electro-optical material layer 175 overlapping the pixels P21, P23, P41, and P43.

In addition, the second voltage V2 may be applied to a portion of the first electro-optical material layer 171 overlapping the pixels P22, P24, P42, and P44, and the second voltage V2 may be applied to a portion of the second electro-optical material layer 175 overlapping the pixels P11, P13, P31, and P33.

Accordingly, a refractive index of the portion of the first electro-optical material layer 171 overlapping the pixels P11, P13, P31, and P33 may be a first refractive index, and a refractive index of the portion of the second electro-optical material layer 175 overlapping the pixels P11, P13, P31, and P33 may be the first refractive index.

In addition, a refractive index of the portion of the first electro-optical material layer 171 overlapping the pixels P12, P14, P32, and P34 may be the first refractive index, and a refractive index of the portion of the second electro-optical material layer 175 overlapping the pixels P12, P14, P32, and P34 may be the second refractive index.

In addition, a refractive index of the portion of the first electro-optical material layer 171 overlapping the pixels P21, P23, P41, and P43 may be the second refractive index, and a refractive index of the portion of the second electro-optical material layer 175 overlapping the pixels P21, P23, P41, and P43 may be the first refractive index.

In addition, a refractive index of the portion of the first electro-optical material layer 171 overlapping the pixels P22, P24, P42, and P44 may be the second refractive index, and a refractive index of the portion of the second electro-optical material layer 175 overlapping the pixels P22, P24, P42, and P44 may be the second refractive index.

According to a first example, when the refractive index of the first electro-optical material layer 171 is about 2.7 and the refractive index of the second electro-optical material layer 175 is about 2.7, red visible light passes through the variable color filter CFL. In the first example, green and blue visible light is blocked from passing through the variable color filter CFL. According to a second example, when the refractive index of the first electro-optical material layer 171 is about 1.6 and the refractive index of the second electro-optical material layer 175 is about 2.7, green visible light passes through the variable color filter CFL. In the second example, red and blue visible light is blocked from passing through the variable color filter CFL. According to a third example, when the refractive index of the first optical material layer 171 is about 2.7 and the refractive index of the second electro-optical material layer 175 is about 1.6, green visible light passes through the variable color filter CFL. In the third example, red and blue visible light is blocked from passing through the variable color filter CFL. According to a fourth example, when the refractive index of the first electro-optical material layer 171 is about 1.6 and the refractive index of the second electro-optical material layer 175 is about 1.6, blue visible light passes through the variable color filter CFL. In the fourth example, red and green visible light is blocked from passing through the variable color filter CFL.

According to an example embodiment, the Bayer pattern as illustrated may be implemented by adjusting the first and second voltages V1 and V2 so that the first refractive index is about 2.7 and the second refractive index is about 1.6.

In an embodiment, when the refractive index of the first electro-optical material layer 171 and the refractive index of the second electro-optical material layer 175 are set to a same first value, light of a first visible color passes through the variable color filter CFL and light of second and third visible colors different from the first visible color are prevented from passing through the variable color filter CFL. In an embodiment, when the refractive index of the first electro-optical material layer 171 is a second value different from the first value and the refractive index of the second electro-optical material layer 175 is set to the first value, light of the second visible color passes through the variable color filter CFL and light of the first and third visible colors are prevented from passing through the variable color filter CFL. In an embodiment, when the refractive index of the first electro-optical material layer 171 is set to the first value and the refractive index of the second electro-optical material layer 175 is set to the second, light of the second visible color passes through the variable color filter CFL and light of the first and third visible colors are prevented from passing through the variable color filter CFL. In an embodiment, when the refractive index of the first electro-optical material layer 171 and the refractive index of the second electro-optical material layer 175 are both set to the second value, light of the third visible color passes through the variable color filter CFL and light of the first and second visible colors are prevented from passing through the variable color filter CFL.

In the present example, a magnitude of the voltage applied to the first and second electro-optical material layers 171 and 175 is proportional to the refractive index of the first and second electro-optical material layers 171 and 175 and the first voltage V1 may be greater than the second voltage V2, but the inventive concept is not limited thereto. For example, as the voltage applied to the first and second electro-optical material layers 171 and 175 increases, the refractive index of the first and second electro-optical material layers 171 and 175 may decrease, and the first voltage V1 may be smaller than the second voltage V2.

In the present embodiment, the first voltage V1 and the second voltage V2 may be applied to the first electrodes 151, 152, 153, and 154 in a spatially alternative way, and the first voltage V1 and the second voltage V2 may be applied to the second electrodes 161, 162, 163, and 164 in a spatially alternative way.

That is, there may be one first electrode 152 to which the second voltage V2 is applied between two adjacent first electrodes 151 and 153 to which the first voltage V1 is applied, and there may be one first electrode 153 to which the first voltage V1 is applied between two adjacent first electrodes 152 and 154 to which the voltage V2 is applied.

Similarly, there may be one second electrode 162 to which the second voltage V2 is applied between two adjacent second electrodes 161 and 163 to which the first voltage V1 is applied, and thereby be one second electrode 162 to which the first voltage V1 is applied between two adjacent second electrodes 162 and 164 to which the second voltage V2 is applied.

Figure 6:
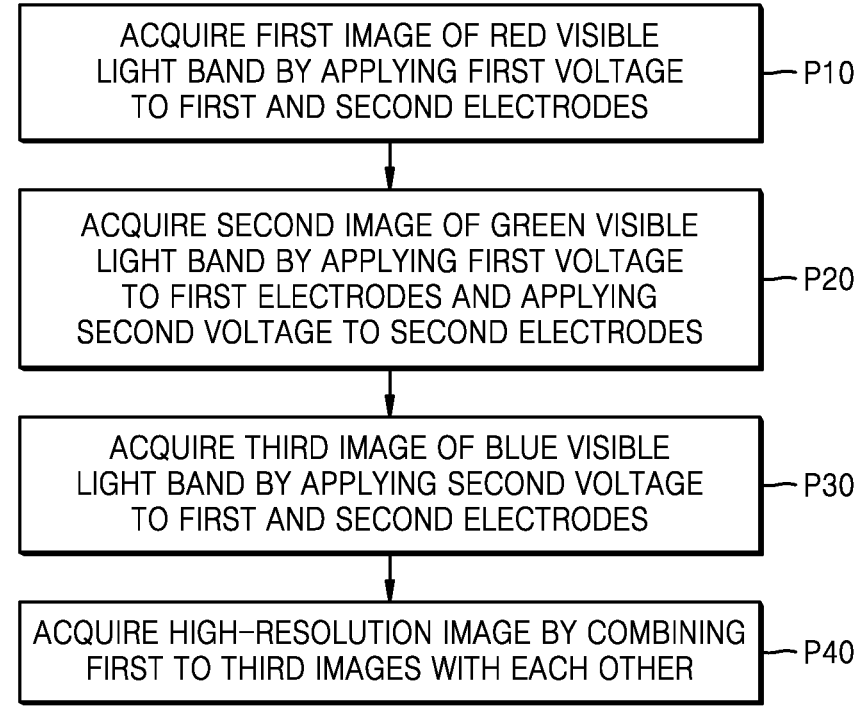
FIG. 6 is a flowchart illustrating an operation of a pixel array according to an example embodiments

FIG. 6 is a flowchart illustrating an operation of the pixel array 10 according to an example embodiment.

Figure 7A:
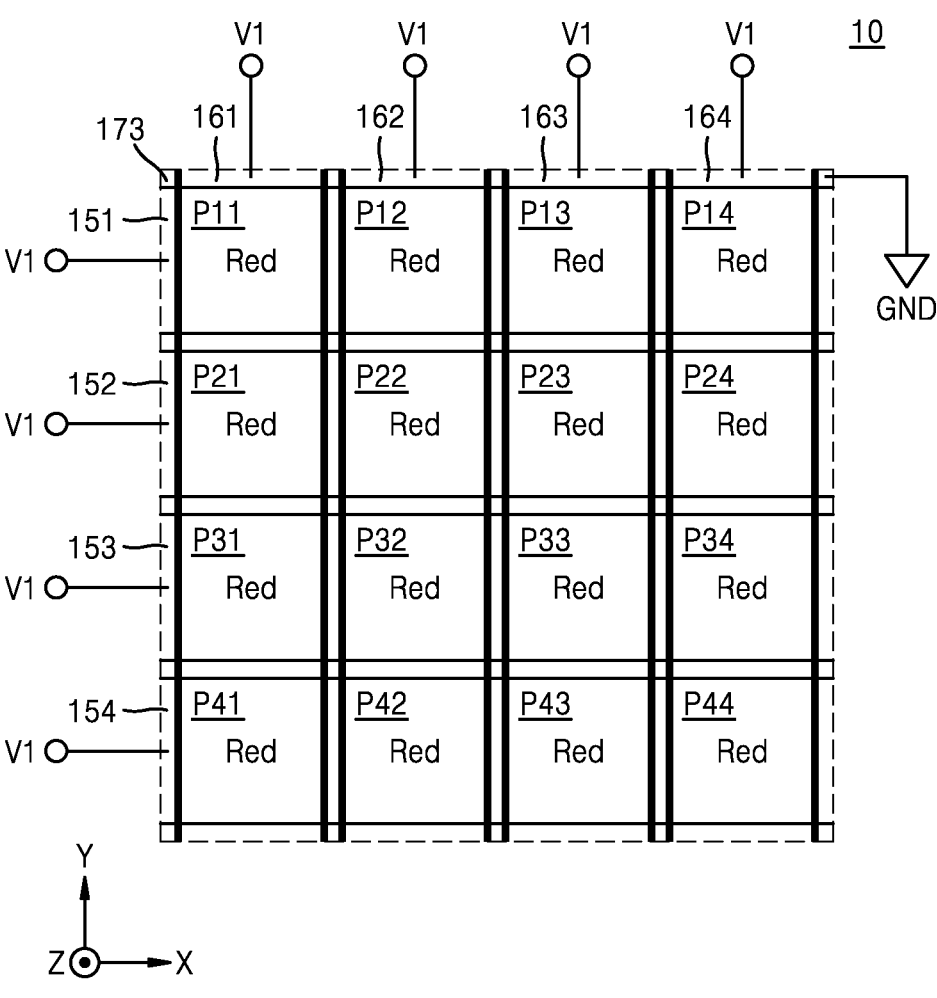
FIGS. 7A to 7C are views illustrating the operation of the pixel array 10 according to an example embodiment.
Figure 7B:
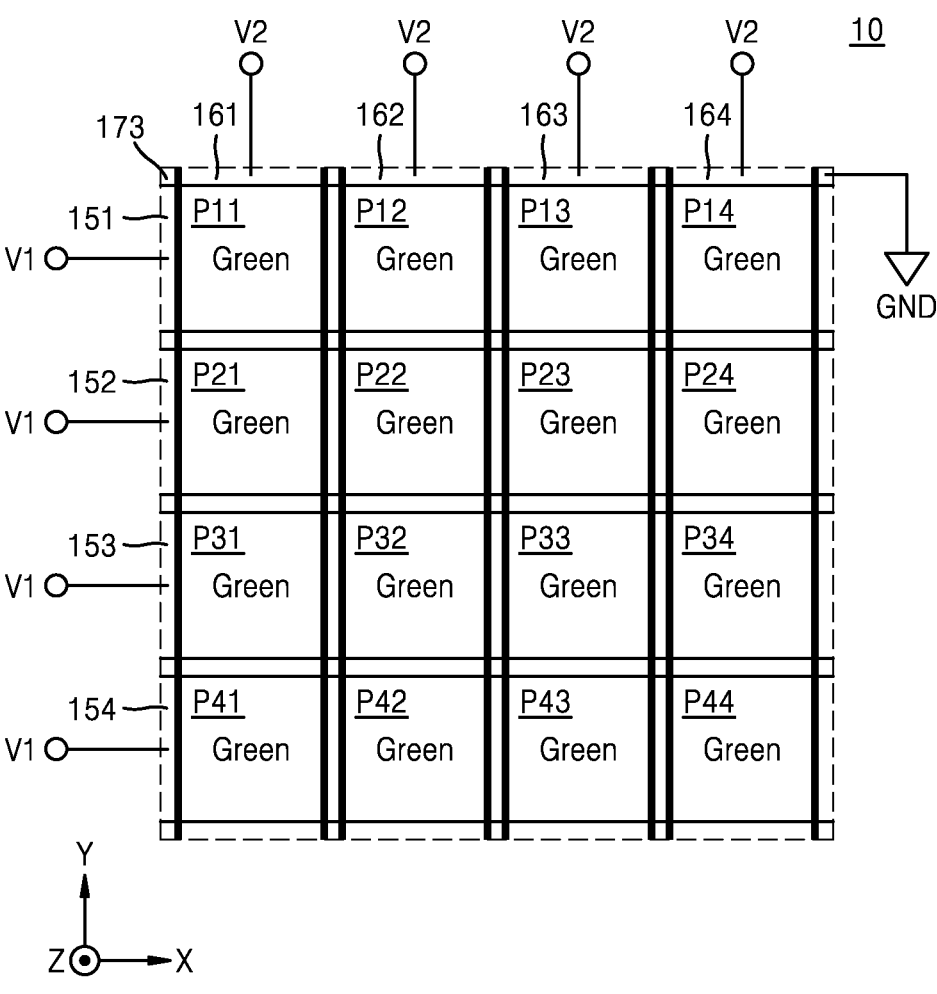
Figure 7C:
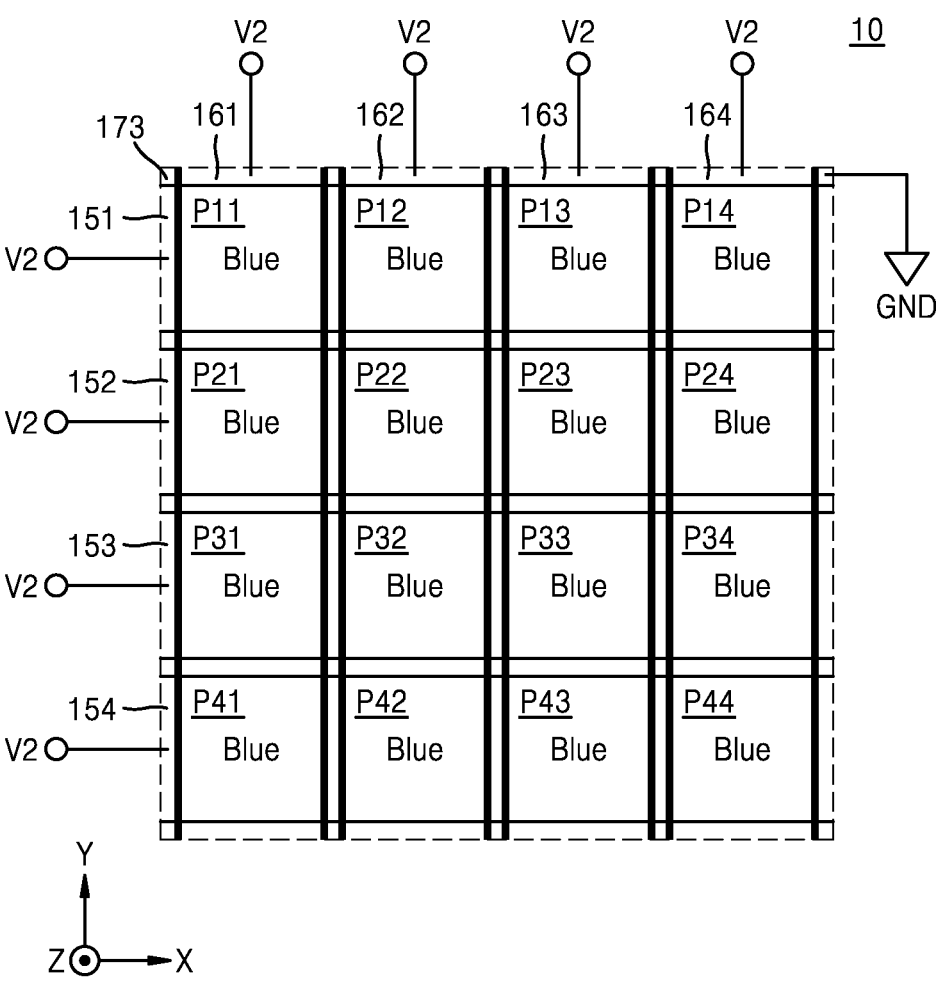

FIGS. 7A to 7C are views illustrating an operation of the pixel array 10 according to an example embodiment.

Referring to FIGS. 4, 6 and 7A, a first image of a red visible light band is acquired by applying the first voltage V1 to the first and second electrodes 151, 152, 153, 154, 161, 162, 163, and 164 at P10.

The first voltage V1 may be applied to each of the first and second electro-optical material layers 171 and 175 in entirety, and accordingly, the refractive index of each of the first and second electro-optical material layers 171 and 175 may be the first refractive index in entirety.

According to an example embodiment, when the first voltage V1 is applied to each of the first and second electrodes 151, 152, 153, 154, 161, 162, 163, and 164, the variable filter layer CFL may be a filter that transmits visible red light in entirety. Accordingly, the pixel array 10 may acquire a first image that is an image of a red visible light band.

Referring to FIGS. 4, 6 and 7B, a second image of a green visible light band is acquired by applying the first voltage V1 to the first electrodes 151, 152, 153, and 154 and applying the second voltage V2 to the second electrodes 161, 162, 163, and 164 at P20. For example, the first voltage V1 may differ from the second voltage V2.

The first voltage V1 may be applied to each of the first electro-optical material layers 171 in entirety, and accordingly, the refractive index of the first electro-optical material layer 171 may be the first refractive index in entirety. The second voltage V2 may be applied to each of the second electro-optical material layers 175 in entirety, and accordingly, the refractive index of the second electro-optical material layer 175 may be the second refractive index in entirety.

According to an example embodiment, when the first voltage V1 is applied to each of the first electrodes 151, 152, 153, and 154, and the second voltage V2 is applied to the second electrodes 161, 162, 163 and 164, the variable filter layer CFL may be a filter that transmits green visible light in entirety. Accordingly, the pixel array 10 may acquire the second image that is an image of the green visible light band. For example, the first voltage V1 may differ from the second voltage V2.

At P20, alternatively, the second image of the green visible light band may be acquired by applying the second voltage V2 to the first electrodes 151, 152, 153, and 154, and applying the first voltage V1 to the second electrodes 161, 162, 163, and 164.

Referring to FIGS. 4, 6, and 7C, a third image of a blue visible light band may be acquired by applying the second voltage V2 to the first and second electrodes 151, 152, 153, 154, 161, 162, 163, and 164 at P30.

The second voltage V2 may be applied to each of the first and second electro-optical material layers 171 and 175, and accordingly, the refractive index of each of the first and second electro-optical material layers 171 and 175 may be the second refractive index in entirety.

According to an example embodiment, when the second voltage V2 is applied to each the first and second electrodes 151, 152, 153, 154, 161, 162, 163, and 164, the variable filter layer CFL may be a filter that transmits blue visible light in entirety. Accordingly, the pixel array 10 may acquire the third image that is an image of the blue visible light band.

Subsequently, referring to FIGS. 1, 3, and 6, a high-resolution image may be acquired by combining the first to third images with each other at P40. Combining of the first to third images may be performed by the processor 60. The first to third images may be images of the same object.

In the case of an image sensor using a Bayer pattern, about 66% of light information is absorbed by a color filter, so that quality of an image may be deteriorated in a low illuminance condition. In addition, spatial resolution is low because each pixel does not read light amount information for red, green, and blue visible light and predicts a light amount of neighboring pixels based on a representative value.

According to an example embodiment, each of the plurality of pixels P11 to P44 receives red visible light when acquiring the first image, receives green visible light when acquiring the second image, and receives blue visible light when acquiring the third image, and therefore, all the pixels P11 to P44 may obtain information on the light amount of each of the red visible light, green visible light, and blue visible light, thereby obtaining a high-resolution image.

Figure 8:
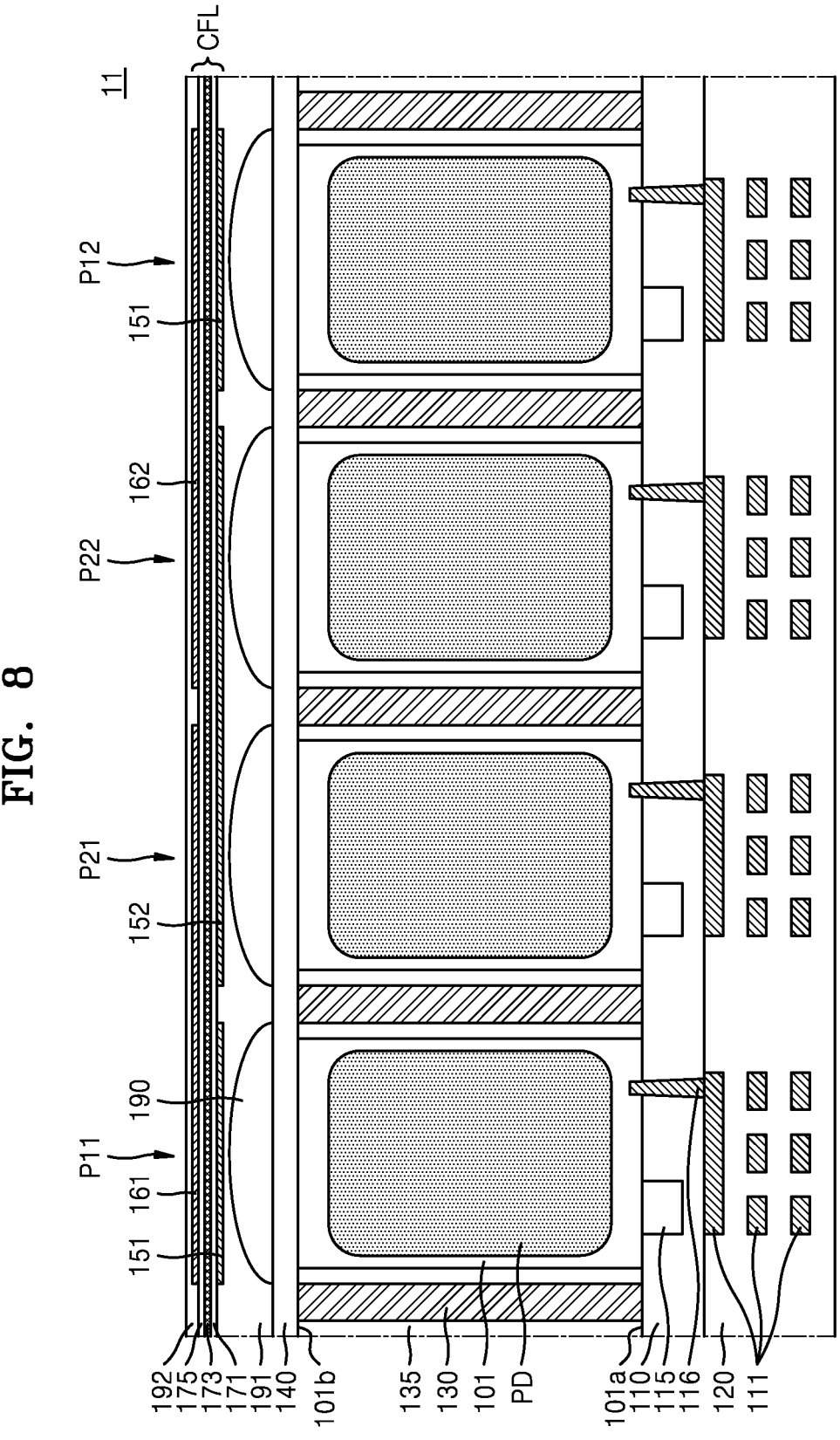
FIG. 8 is a cross-sectional view illustrating a pixel array of an image sensor according to an example embodiment.

FIG. 8 is a cross-sectional view illustrating a pixel array 11 of an image sensor according to an example embodiment, and shows a portion corresponding to FIG. 4.

Referring to FIG. 8, the pixel array 11 includes a substrate 101, a photoelectric conversion element PD, a gate electrode 115, an insulating layer 110, a contact via 116, conductive patterns 111, and an interlayer insulating layer 120, first and second device isolation layers 130 and 135, a passivation layer 140, microlenses 190, a planarization layer 191, a variable filter layer CFL, and a planarization layer 192.

The substrate 101, photoelectric conversion element PD, gate electrode 115, insulating layer 110, contact via 116, conductive patterns 111, interlayer insulating layer 120, first and second device isolation layers 130 and 135, and the passivation layer 140 are substantially the same as those described above with reference to FIGS. 3 and 4, and thus redundant description thereof is omitted.

According to an example embodiment, the microlenses 190 may be disposed on the passivation layer 140.

The planarization layer 191 covering the microlenses 190 may be disposed on the microlenses 190. According to an example embodiment, the planarization layer 191 may include a light-transmitting material. According to an example embodiment, the planarization layer 191 may include an insulating material.

The variable filter layer CFL may be disposed on the planarization layer 191. The dimensional, compositional, and structural characteristics of the variable filter layer CFL are similar to those described above with reference to FIGS. 3 and 4, except that the variable filter layer CFL is disposed on the planarization layer 191.

Figure 9:
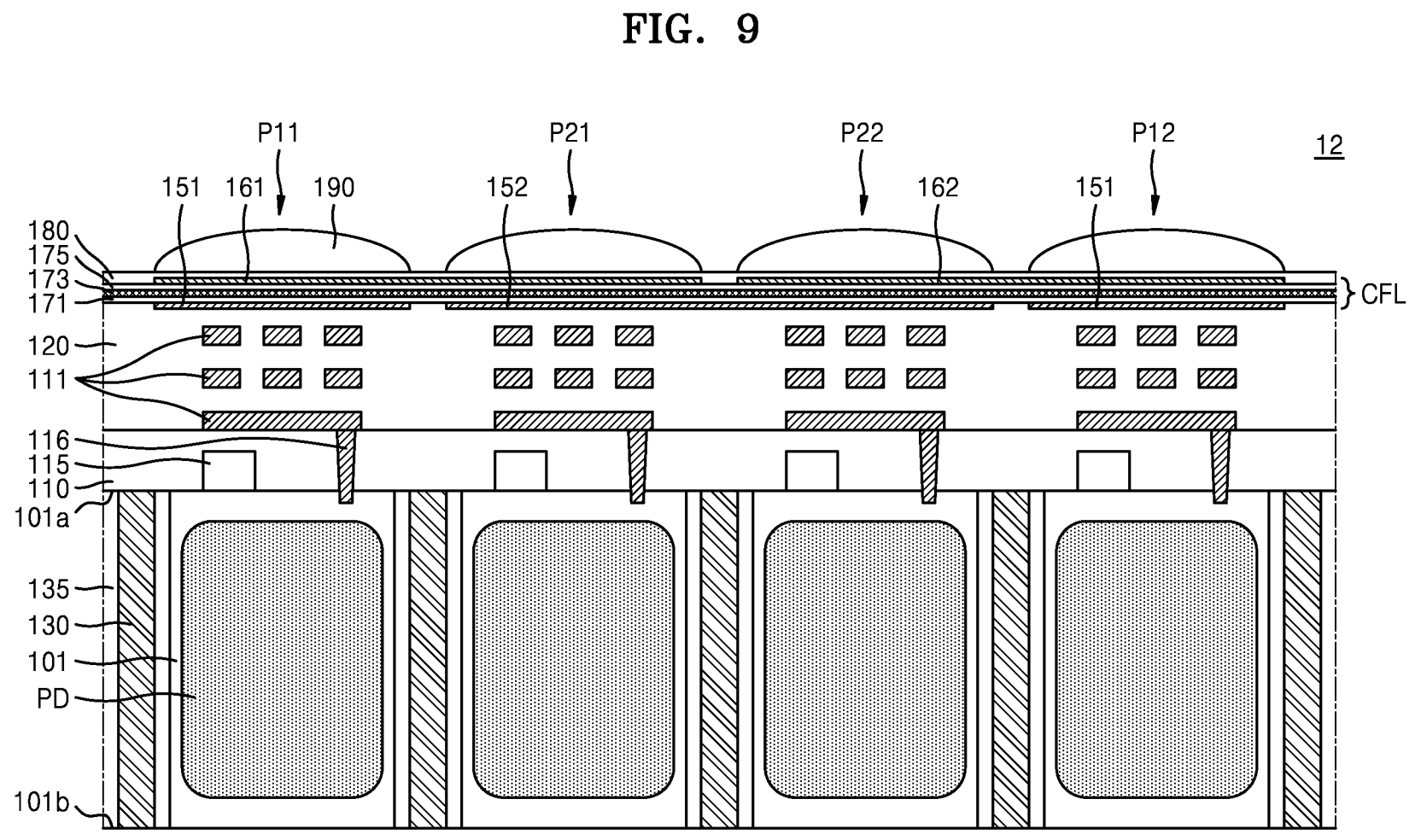

FIG. 9 is a cross-sectional view illustrating a pixel array 12 of an image sensor according to an example embodiment, and shows a portion corresponding to FIG. 4.

Referring to FIG. 9, the pixel array 12 may include a substrate 101, a photoelectric conversion element PD, a gate electrode 115, an insulating layer 110, a contact via 116, conductive patterns 111, an interlayer insulating layer 120, first and second device isolation layers 130 and 135, a variable filter layer CFL, a planarization layer 180, and microlenses 190.

The substrate 101, photoelectric conversion element PD, gate electrode 115, insulating layer 110, contact via 116, conductive patterns 111, interlayer insulating layer 120, and first and second device isolation layers 130 and 135 are substantially the same as those described above with reference to FIGS. 3 and 4, and thus a redundant description thereof is omitted.

According to an example embodiment, the pixel array 12 may include a front-illuminated image sensor. That is, light collected by the microlenses 190 may be incident on the photoelectric conversion element PD through the first surface 101*a* of the substrate 101.

The interlayer insulating layer 120, the contact via 116 covered by the interlayer insulating layer 120, and the conductive patterns 111 may be interposed between the microlenses 190 and the substrate 101. The variable filter layer CFL may be spaced apart from the substrate 101 with the interlayer insulating layer 120, the contact via 116 covered by the interlayer insulating layer 120, and the conductive patterns 111 therebetween.

The variable filter layer CFL may be disposed on the interlayer insulating layer 120, and the planarization layer 180 may be disposed on the variable filter layer CFL. The dimensional, compositional, and structural characteristics of the variable filter layer CFL are similar to those described above with reference to FIGS. 3 and 4, except that the variable filter layer CFL is disposed between the planarization layer 180 and the interlayer insulating layer 120.

While the inventive concept has been particularly shown and described with reference to embodiments thereof, it will be understood that various changes in form and details may be made therein without departing from the spirit and scope of the following claims.

What is claimed is:

1. An image sensor comprising:
a substrate including a plurality of photoelectric conversion elements;
a variable filter layer disposed on the substrate; and
a plurality of microlenses disposed on the variable filter layer,
wherein the variable filter layer comprises:
a plurality of first electrodes extending in a first direction, and having a first width in a second direction;
a first electro-optical material layer disposed on the plurality of first electrodes;
a light-transmitting electrode disposed on the first electro-optical material layer;
a second electro-optical material layer disposed on the light-transmitting electrode; and
a plurality of second electrodes disposed on the second electro-optical material layer, extending in the second direction, and having a second width in the first direction,
wherein the variable filter layer is operated as:
i) a Bayer filter when some of the first electrodes receive a first voltage greater than a reference potential and the rest of the first electrodes receive a second voltage less than the first voltage and greater than the reference potential, and
ii) a filter for light of a single color when all of the first electrodes and all of the second electrodes receive either the first voltage or the second voltage.

2. The image sensor of claim 1, wherein the first electro-optical material layer and the second electro-optical material layer each include one of 4-N,N-dimethylamino-4'-N'-methyl-stilbazolium tosylate (DAST), lithium niobide (LiNb03), lithium tantalate (LiTa03), potassium titanyl phosphate (KTP), and beta ((3)-barium borate (BBO).

3. The image sensor of claim 1, wherein the first electrodes and the second electrodes each include silver (Ag).

4. The image sensor of claim 1, wherein the light-transmitting electrode includes one of indium tin oxide (ITO), a silver nanowire, a carbon nanotube (CNT), graphene, and a conducting polymer.

5. The image sensor of claim 1, wherein a reference potential is applied to the light-transmitting electrode.

6. The image sensor of claim 5, wherein one of the first voltage and the second voltage is applied to each of the plurality of first electrodes and each of the plurality of second electrodes, and the first voltage is greater than the second voltage, and the second voltage is greater than the reference potential.

7. The image sensor of claim 6, wherein the variable filter layer is configured to have a Bayer pattern when the first voltage is applied to a first portion of the plurality of first electrodes, the second voltage is applied to a second portion of the plurality of first electrodes, the first voltage is applied to a third portion of the plurality of second electrodes, and the second voltage is applied to a fourth portion of the plurality of second electrodes.

8. The image sensor of claim 7, wherein each of the first portion of the plurality of first electrodes is interposed between the second portion of the plurality of first electrodes, and each of the second portion of the plurality of first electrodes is interposed between the first portion of the plurality of first electrodes.

9. The image sensor of claim 7, wherein each of the third portion of the plurality of second electrodes is interposed between the fourth portion of the plurality of second electrodes, and each of the fourth portion of the plurality of second electrodes is interposed between the third portion of the plurality of second electrodes.

10. An image sensor comprising:
a substrate including a plurality of pixels, the plurality of pixels including a plurality of photoelectric conversion elements;
a variable filter layer disposed on the substrate;
a plurality of conducting patterns providing a path for outputting an electrical signal generated by the plurality of photoelectric conversion elements, the plurality of pixels including a first pixel, a second pixel, a third pixel, and a fourth pixel arranged in a 2×2 matrix form, the first and second pixels arranged adjacent to each other in a first direction, the third and fourth pixels arranged adjacent to each other in the first direction and spaced apart from the first and second pixels in a second direction; and
an interlayer insulating layer covering the plurality of conductive patterns, wherein the variable filter layer comprises:
a plurality of first electrodes extending in the first direction, and spaced apart from each other in the second direction, a first one of the plurality of first electrodes overlapping the first pixel and the second pixel, a second one of the plurality of first electrodes overlapping the third pixel and the fourth pixel;
a first electro-optical material layer disposed on the plurality of first electrodes;
a light-transmitting electrode disposed on the first electro-optical material layer;
a second electro-optical material layer disposed on the light-transmitting electrode;
a plurality of second electrodes disposed on the second electro-optical material layer, extending in the second direction, and spaced apart from each other in the first direction, a first one of the plurality of second electrodes overlapping the first pixel and the third pixel, a second one of the plurality of second electrodes over-lapping the second pixel and the fourth pixel; and a plurality of microlenses being disposed between the substrate and either of the plurality of first electrodes or the plurality of second electrodes, wherein the variable filter layer is operated as:

i) a Bayer filter when some of the first electrodes receive a first voltage greater than a reference poten-tial and the rest of the first electrodes receive a second voltage less than the first voltage and greater than the reference potential, and ii) a filter for light of a single color when all of the first electrodes and all of the second electrodes receive either the first voltage or the second voltage.

11. The image sensor of claim 10, wherein the variable filter layer is operated the Bayer filter when the first one of the first electrodes receive the first voltage greater than the reference potential, the second one of the first electrodes receive the second voltage less than the first voltage and greater than the reference potential, the first one of the second electrodes receive the first voltage, and the second one of the second electrodes receive the second voltage.

12. The image sensor of claim 11, wherein a first portion of the variable filter layer overlapping the first pixel is configured to operate as a red filter, a second portion of the variable filter layer overlapping the second pixel is config-ured to operate as a green filter, a third portion of the variable filter layer overlapping the third pixel is configured to operate as a green filter, and a fourth portion of the variable filter layer overlapping the fourth pixel is configured to operate as a blue filter.

13. The image sensor of claim 11, wherein the plurality of microlenses is configured to focus external light onto the plurality of photoelectric con-version elements, wherein the variable filter layer is spaced apart from the substrate with the plurality of microlenses disposed therebetween.

14. The image sensor of claim 13, further comprising:

a planarization layer covering the plurality of microl-enses, wherein the variable filter layer is disposed on the planarization layer.

15. The image sensor of claim 10, wherein the variable filter layer is spaced apart from the substrate with the plurality of conducting patterns and the interlayer insulating layer disposed between the variable filter layer and the substrate.

16. An image sensor comprising:

a substrate including a plurality of photoelectric conver-sion elements;

a variable filter layer disposed on the substrate;

a plurality of conducting patterns providing a path for outputting an electrical signal generated by the plurality of photoelectric conversion elements;

an interlayer insulating layer covering the plurality of conductive patterns; and a plurality of microlenses focusing external light onto the plurality of photoelectric conversion elements, wherein the variable filter layer comprises:

a plurality of first electrodes extending in a first direction;

a first electro-optical material layer disposed on the plu-rality of first electrodes;

a light-transmitting electrode disposed on the first electro-optical material layer and configured to receive a reference potential;

a second electro-optical material layer disposed on the light-transmitting electrode; and a plurality of second electrodes disposed on the second electro-optical material layer and extending in a second direction, and wherein the variable filter layer is operated as:

i) a Bayer filter when some of the first electrodes receive a first voltage greater than the reference potential and the rest of the first electrodes receive a second voltage less than the first voltage and greater than the reference potential, and ii) a filter for light of a single color when all of the first electrodes and all of the second electrodes receive either the first voltage or the second voltage.

17. The image sensor of claim 16, wherein the variable filter layer is configured to operate as a red filter that allows red visible light to pass therethrough and blocks blue visible light and green visible light when the first voltage is applied to each of the plurality of first electrodes and the first voltage is applied to each of the plurality of second electrodes.

18. The image sensor of claim 16, wherein the variable filter layer is configured to operate as a green filter that allows green visible light to pass therethrough and blocks red visible light and blue visible light when the second voltage is applied to each of the plurality of first electrodes and the first voltage is applied to each of the plurality of second electrodes.

19. The image sensor of claim 16, wherein the variable filter layer is configured to operate as a green filter that allows green visible light to pass therethrough and blocks red visible light and blue visible light when the first voltage is applied to each of the plurality of first electrodes and the second voltage is applied to each of the plurality of second electrodes.

20. The image sensor of claim 16, wherein the variable filter layer is configured to operate as a blue filter that allows blue visible light to pass therethrough and blocks red visible light and green visible light when the second voltage is applied to each of the plurality of first electrodes and the second voltage is applied to each of the plurality of second electrodes.

* * * * *